United States Patent
Davis et al.

(10) Patent No.: US 6,608,327 B1
(45) Date of Patent: *Aug. 19, 2003

(54) GALLIUM NITRIDE SEMICONDUCTOR STRUCTURE INCLUDING LATERALLY OFFSET PATTERNED LAYERS

(75) Inventors: Robert F. Davis, Raleigh, NC (US); Ok-Hyun Nam, Seoul (KR)

(73) Assignee: North Carolina State University, Raleigh, NC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,843

(22) Filed: Feb. 27, 1998

(51) Int. Cl.$^7$ .......................... H01L 31/0256
(52) U.S. Cl. .................. 257/76; 257/103; 257/615
(58) Field of Search ................. 257/638, 615, 257/76, 103; 148/33.4; 117/95, 106

(56) References Cited

U.S. PATENT DOCUMENTS

| | | | |
|---|---|---|---|
| 4,127,792 A | 11/1978 | Nakata | 313/500 |
| 4,522,661 A | 6/1985 | Morrison et al. | 148/33.2 |
| 4,651,407 A * | 3/1987 | Bencuya | 29/571 |
| 4,865,685 A | 9/1989 | Palmour | 156/643 |
| 4,876,210 A * | 10/1989 | Barnett et al. | 437/5 |
| 4,912,064 A | 3/1990 | Kong et al. | 437/100 |
| 4,946,547 A | 8/1990 | Palmour et al. | 156/643 |
| 5,122,845 A * | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A * | 2/1995 | Takeuchi et al. | 437/133 |
| 5,397,736 A * | 3/1995 | Bauser et al. | 437/92 |

(List continued on next page.)

FOREIGN PATENT DOCUMENTS

| | | |
|---|---|---|
| CA | 2258080 | 10/1998 |
| EP | 0 551 721 A2 | 7/1993 |
| EP | 0 852 416 A1 | 7/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |

(List continued on next page.)

OTHER PUBLICATIONS

International Search Report, PCT/US99/04346, Jun. 9, 1999.

Nakamura, *InGaN–Based Violet Laser Diodes*, Semicond. Sci. Technol., 14, 1999, pp. R27–R40.

(List continued on next page.)

*Primary Examiner*—Eddie Lee
*Assistant Examiner*—N. Drew Richards
(74) *Attorney, Agent, or Firm*—Myers Bigel Sibley & Sajovec

(57) ABSTRACT

A gallium nitride semiconductor layer is fabricated by masking an underlying gallium nitride layer with a first mask that includes a first array of openings therein and growing the underlying gallium nitride layer through the first array of openings and onto the first mask, to thereby form a first overgrown gallium nitride semiconductor layer. The first overgrown layer is then masked with the second mask that includes a second array of openings therein. The second array of openings is laterally offset from the first array of openings. The first overgrown gallium nitride layer is then grown through the second array of openings and onto the second mask, to thereby form a second overgrown gallium nitride semiconductor layer. Microelectronic devices may then be formed in the second overgrown gallium nitride semiconductor layer.

16 Claims, 4 Drawing Sheets

U.S. PATENT DOCUMENTS

| | | | | |
|---|---|---|---|---|
| 5,549,747 A | * | 8/1996 | Bozler et al. | 117/43 |
| 5,710,057 A | | 1/1998 | Kenney | 437/62 |
| 5,760,426 A | * | 6/1998 | Marx et al. | 257/190 |
| 5,786,606 A | * | 7/1998 | Nishio et al. | 257/103 |
| 5,815,520 A | * | 9/1998 | Furushima | 372/45 |
| 5,877,070 A | | 3/1999 | Goesele et al. | 438/458 |
| 5,880,485 A | | 3/1999 | Marx et al. | 257/94 |
| 5,912,477 A | | 6/1999 | Negley | 257/95 |
| 5,915,194 A | | 6/1999 | Powell et al. | 438/478 |
| 6,051,849 A | | 4/2000 | Davis | 257/103 |
| 6,100,104 A | | 8/2000 | Haerle | 438/33 |
| 6,100,111 A | | 8/2000 | Konstantinov | 438/92 |
| 6,121,121 A | | 9/2000 | Koide | 438/481 |
| 6,153,010 A | | 11/2000 | Kiyoku et al. | 117/95 |
| 6,156,584 A | | 12/2000 | Itoh et al. | 438/33 |

FOREIGN PATENT DOCUMENTS

| | | |
|---|---|---|
| JP | 08-064791 | 3/1996 |
| JP | 8-116093 | 5/1996 |
| JP | 8-125251 | 5/1996 |
| JP | 8-153931 | 6/1996 |
| JP | HEI 9-93315 | 4/1997 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |

OTHER PUBLICATIONS

Nakamura et al., *Violet InGaN/GaN/AlGaN–Based Laser Diodes Operable at 50° C. With a Fundamental Transverse Mode*, Jpn. J. Appl. Phys. vol. 38, Part 1, No. 3A, Mar. 1, 1999, pp. L226–L229.

Mahajan et al., *Principles of Growth and Processing of Semiconductors*, WCB McGraw–Hill, 1999, pp. 268–275, 352–365.

Tu et al., *Electronic Thin Film Science*, MacMillan Publishing Company, 1992, pp. 46–73, 184–187.

Wolf et al., *Silicon Processing for the VLSI Era, vol. 1 Process Technology*, Lattice Press, 1986, 36–44.

Naritsuka et al., *Epitaxial Lateral Overgrowth of InP by Liquid Phase Epitaxy*, Journal of Crystal Growth, vol. 146, 1995, pp. 314–318.

Allegretti et al., *In–situ Observation of GaAs Selective Epitaxy on GaAs (111)B Substrates*, Journal of Crystal Growth, vol. 146, 1995, pp. 354–358.

Allegretti et al., *Periodic Supply Epitaxy: A New Approach for the Selective Area Growth of GaAs by Molecular Beam Epitaxy*, Journal of Crystal Growth, vol. 156, 1995, pp. 1–10.

Sakawa et al., *Effect of Si Doping on Epitaxial Lateral Overgrowth of GaAs on GaAs–Coated Si Substrate*, Japanese Journal of Applied Physics, Part 2, No. 3B, Mar. 15, 1992, pp. L359–L361.

Kinoshita et al., *Epitaxial Laterla Overgrowth of Si on Non–Planar Substrate*, Journal of Crystal Growth, vol. 115, 1991, pp. 561–566.

Zhang et al., *Epitaxial Lateral Overgrowths of GaAs on (001) GaAs Substrates by LPE: Growth Behavior and Mechanism*, Journal of Crystal Growth, vol. 99, 1990, pp. 292–296.

Suzuki et al., *Si LPE Lateral Overgrowth From a Ridge Seed*, Japanese Journal of Applied Physics, vol. 29, No. 12, Dec., 1990, pp. 2685–2689.

Zhang et al., *LPE Lateral Overgrowth of GaP*, Japanese Journal of Applied Physics, vol. 29,No. 3, Mar. 1990, pp. 545–550.

Suzuki et al., *Epitaxial Lateral Overgrowth of Si by LPE With Sn Solution and Its Orientation Dependence*, Japanese Journal of Applied Physics, vol. 28, No. 3, Mar. 1989, pp. 440–445.

Suzuki et al., *The Sources of Atomic Steps in Epitaxial Lateral Overgrowth of Si*, Journal of Crystal Growth, vol. 99, 1989, pp. 229–234.

Nishinaga et al., *Epitaxial Lateral Overgrowth of GaAs by LPE*, Japanese Journal of Applied Physics, vol. 27, No. 6, Jun. 1988, pp. L964–L967.

*Gallium Nitride–2000–Technology, Status, Applications, and Market Forecasts*, Strategies Unlimited, Report SC–23, May 2000.

Chen et al., *Dislocation Reducing in GaN Thin Films Via Lateral Overgrowth From Trenches*, Applied Physics Letters, vol. 75, No. 14, Oct. 4, 1999, pp. 2062–2063.

Hiramatsu et al., *Selective Area Growth and Epitaxial Lateral Overgrowth of GaN*, Properties, Processing and Applications of Gallium Nitride and Related Semiconductors, EMIS Datareviews Series No. 23, 1998, pp. 440–446.

Nakamura, *InGaN/GaN/AlGaN–Based Laser Diodes*, Properties, Processing and Applications of Gallium Nitride and Related Semiconductors, EMIS Datareviews Series No. 23, 1998, pp. 587–595.

Sakai, *Defect Structure in Selectively Grown GaN Films With Low Threading Dislocation Density*, Appl. Phys. Lett., vol. 71, No. 16, Oct. 20, 1997, pp. 2259–2261.

Gustafsson et al., *Investigations of High Quality $Ge_xSi_{1-x}$ Grown by Heteroepitaxial Lateral Overgrowth Using Cathoduluminescence*, Inst. Phys. Conf. Ser. No. 134: Section 11, Micros. Semicond. Mater. Conf., Oxford, Apr. 5–8, 1993, pp. 675–678.

Givargizov, *Other Approaches to Oriented Crystallization on Amorphous Substrates*, Chapter 4, Oriented Crystallization on Amorphous Substrates, Plenum Press, 1991, pp. 221–264.

Akasaki et al., *Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE*, Journal of Crystal Growth, vol. 98, 1989, pp. 209–219.

Ujiie et al., *Epitaxial Lateral Overgrowth of GaAs on a Si Substrate*, Jpn. J. Appl. Phys., vol. 28, 1989, p. L337–L339.

Ishiwara et al., *Lateral Solid Phase Epitaxy of Amorphous Si Films on Si Substrates With $SiO_2$ Patterns*, Applied Physics Letters, vol. 43, No. 11, Dec. 1, 1983, pp. 1028–1030.

Jastrzebski, *SOI by CVD: Epitaxial Lateral Overgrowth (ELO) Process–Review*, Journal of Crystal Growth, vol. 63, 1983, pp. 493–526.

Rathman et al., *Lateral Epitaxial Overgrowth of Silicon on $SiO_2$*, Journal of the Electrochemical Society, Oct. 1982, pp. 2303–2306.

Shaw, *Selective Epitaxial Deposition of Gallium Arsenide in Holes*, Journal of the Electrochemical Society Sep. 1966, pp. 904–908.

Tausch, Jr. et al., *A Novel Crystal Growth Phenomenon: Single Crystal GaAs Overgrowth Onto Silicon Dioxide*, Journal of the Electrochemical Society, Jul. 1965, pp. 706–709.

Joyce et al., *Selective Epitaxial Deposition of Silicon*, Nature, vol. 4840, Aug. 4, 1962, pp. 485–486.

Leo *Unmasked by Pendeo–Epitaxy*, Compound Semiconductor, Mar. 1999, p 16.

International Search Report, PCT/US99/27358, Apr. 28, 2000.

International Search Report, PCT/US99/28056, Apr. 26, 2000.

Boo et al., *Growth of Hexagonal GaN Thin Films on Si(111) with Cubic SiC Buffer Layers*, Journal of Crystal Growth 189–190, 1998, pp. 183–188.

Linthicum et al., *Process Routes for Low–Defect Density GaN on Various Substrates Employing Pendeo–Epitaxial Growth Techniques*, MRS Internet Journal of Nitride Semiconductor Research, Fall Meeting of the Materials Research Society, vol. 4S1, No. G4.9, Nov. 30, 1998–Dec. 4, 1998.

Steckl et al., *SiC Rapid Thermal Corbonization of the (111)Si Semiconductor–on–Insulator Structure and Subsequent Metalorganic Chemical Vapor Deposition*, Appl. Phys. Let., 69 (15), Oct. 7, 1996, pp. 2264–2266.

International Search Report, PCT/US99/12967, Oct. 18, 1999.

Linthicum et al., *Pendeoepitaxy of Gallium Nitride Thin Films*, Applied Physics Letters, vol. 75, No. 2, Jul. 12, 1999, pp. 196–198.

Zheleva et al., *Pendeo–Epitaxy: A New Approach for Lateral Growth of Gallium Nitride Films*, Journal of Electronic Materials, vol. 28, No. 4, Feb. 1999, pp. L5–L8.

Zheleva et al., *Pendeo–Epitaxy—A New Approach for Lateral Growth of GaN Structures*, MRS Internet Journal of Nitride Semiconductor Research, 1999, Online!, vol. 4S1, No. G3.38, Nov. 30, 1998–Dec. 4, 1998.

Nakamura et al., *InGaN/GaN/AlGaN–Based Laser Diodes Grown on GaN Substrates With a Fundamental Transverse Mode*, Jpn. J. Appl. Phys., vol. 37, Sep. 15, 1998, pp. L1020–L1022.

Marchand et al., *Microstructure of GaN Laterally Overgrown by Metalorganic Chemical Vapor Deposition*, Applied Physics Letters, vol. 73, No. 6, Aug. 10, 1998, pp. 747–749.

Sakai et al., *Transmission Electron Microscopy of Defects in GaN Films Formed by Epitaxial Lateral Overgrowth*, vol. 73, No. 4, Jul. 27, 1998, pp. 481–483.

Nakamura et al., *High–Power, Long–Lifetime InGaN/GaN/AlGaN–Based Laser Diodes Grown on Pure GaN Substrates*, Jpn. J. Appl. Phys., vol. 37, Mar. 15, 1998, pp. L309–L312.

Nam et al., *Lateral Epitaxial Overgrowth of GaN Films on $SiO_2$ Areas Via Metalorganic Vapor Phase Epitaxy*, Journal of Electronic Materials, vol. 27, No. 4, 1998, pp. 233–237.

Wu et al., *Growth and Characterization of SiC Films on Large–Area Si Wafers by APCVD–Temperature Dependence*, Materials Science Forum, vols. 264–268, 1998, pp. 179–182.

Nam et al., *Lateral Epitaxy of Low Defect Density GaN Layers Via Organometallic Vapor Phase Epitaxy*, Appl. Phys. Lett., vol. 71, No. 18, Nov. 3, 1997, pp. 2638–2640.

Zheleva et al., *Dislocation Density Reduction Via Lateral Epitaxy in Selectively Grown GaN Structures*, Appl. Phys. Lett., vol. 71, No. 17, Oct. 27, 1997, pp. 2472–2474.

Doverspike et al., *The Effect of GaN and AlN Buffer Layers on GaN Film Properties Grown on Both C–Plane and A–Plane Sapphire*, Journal of Electronic Materials, vol. 24, No. 4, 1995, pp. 269–273.

Kuznia et al., *Influence of Buffer Layers on the Deposition of High Quality Single Crystal GaN Over Sapphire Substrates*, J. Appl. Phys., vol. 73, No. 9, May 1, 1993, pp. 4700–4702.

Watanabe et al., *The Growth of Single Crystalline GaN on a Si Substrate Using AlN As An Intermediate Layer*, Journal of Crystal Growth, vol. 128, 1993, pp. 391–396.

Nakamura, *GaN Growth Using GaN Buffer Layer*, Japanese Journal of Applied Physics, vol. 30, No. 10A, Oct. 1991, pp. L1705–L1707.

Chen et al., *Silicon–on–Insulator: Why, How, and When*, AIP Conference Proceedings, vol. 167, No. 1, Sep. 15, 1988, pp. 310–319.

Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353–355.

Yoshida et al., *Improvements on the Electrical and Luminescent Properties of Reactive Molecular Beam Epitaxially Grown GaN Films by Using AlN–Coated Sapphire Substrates*, Applied Physics Letters, vol. 42, No. 5, Mar. 1, 1983, pp. 427–429.

Kapolnek et al., "*Anisotropic Epitaxial Lateral Growth in GaN Selective Area Epitaxy*", Appl. Phys. Lett. 71 (9), Sep. 1, 1997, pp. 1204–1206.

Usui et al., "*Thick GaN Epitaxial Growth With Low Dislocation Density by Hydride Vapor Phase Epitaxy*", Jpn. J. Appl. Phys., vol. 36, Part 2, No. 7B, Jul. 15, 1997, pp. 899–902.

Nam, et al., "*Growth of GaN and $Al_{0.2}Ga_{0.8}N$ on Patterned Substrates Via Organometallic Vapor Phase Epitaxy*", Jpn. J. Appl. Phys., vol. 36, Part 2, No. 5A, May 1, 1997, pp. 532–535.

Nam et al., "*Selective Growth of GaN and $Al_{0.2}Ga_{0.8}N$ on GaN/AlN/6H–SiC(0001) Multilayer Substrates Via Organometallic Vapor Phase Epitaxy*", Proceedings MRS, Dec. 1996, 6 pp.

Kapolnek et al., "*Selective Area Epitaxy of GaN for Electron Field Emission Devices*", Journal of Crystal Growth, 5451, 1996, pp. 1–4.

Weeks et al, "*GaN Thin Films Deposited Via Organometallic Vapor Phase Epitaxy on $\alpha(6H)$–SiC(0001) Using High–Temperature Monocrystalline AlN Buffer Layers*", Appl. Phys. Lett. 67 (3), Jul. 17, 1995, pp. 401–403.

Kato et al., "*Selective Growth of Wurtzite GaN and $Al_xGa_{1-x}N$ on GaN/Sapphire Substrates by Metalorganic Vapor Phase Epitaxy*", Journal of Crystal Growth, 144, 1994, pp. 133–140.

Yamaguchi et al, "*Lateral Supply Mechanisms in Selective Metalorganic Chemical Vapor Deposition*", Jpn. Appl. Phys., vol. 32 (1993), pp. 1523–1527.

Nakamura et al., *InGaN/GaN/AlGaN–Based Laser Diodes With Modulation–Doped Strained–Layer Superlattices*, Jpn. J. Appl. Phys., vol. 36, Part 2, No. 12A, Dec. 1, 1997, pp. L1568–L1571.

Gehrke et al., *Pendeo–Epitaxy of Gallium Nitride and Aluminum Nitride Films and Heterostructures on Silicon Carbide Substrate*, MRS Internet J. Semicond. Res. 4S1, G3.2, 1999, 6 pp.

Honda et al., *Selective Area Growth of GaN Microstructures on Patterned (111) and (001) Si Substrates*, 4$^{th}$ European Workshop on GaN, Nottingham, UK, Jul. 2–5, 2000.

Gehrke et al., *Pendeo–Epitaxial Growth of Gallium Nitride on Silicon Substrates*, Journal of Electronic Materials, vol. 29, No. 3, Mar. 2000, pp. 306–310.

* cited by examiner

GALLIUM NITRIDE SEMICONDUCTOR STRUCTURE INCLUDING LATERALLY OFFSET PATTERNED LAYERS

FEDERALLY SPONSORED RESEARCH

This invention was made with Government support under Office of Naval Research Contact No. N00014-96-1-0765. The Government has certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It is also known to fabricate gallium nitride structures through openings in a mask. For example, in fabricating field emitter arrays, it is known to selectively grow gallium nitride on stripe or circular patterned substrates. See, for example, the publications by coinventor Nam et al. entitled "Selective Growth of GaN and $Al_{0.2}Ga_{0.8}N$ on GaN/AlN/6H—SiC(0001) Multilayer Substrates Via Organometallic Vapor Phase Epitaxy", Proceedings of the Materials Research Society, December 1996, and "Growth of GaN and $Al_{0.2}Ga_{0.8}N$ on Patterened Substrates via Organometallic Vapor Phase Epitaxy", Japanese Journal of Applied Physics., Vol. 36, Part 2, No. 5A, May 1997, pp. L-532-L535. As disclosed in these publications, undesired ridge growth or lateral overgrowth may occur under certain conditions.

SUMMARY OF THE INVENTION

It is therefore an object of the present invention to provide improved methods of fabricating gallium nitride semiconductor layers, and improved gallium nitride layers so fabricated.

It is another object of the invention to provide methods of fabricating gallium nitride semiconductor layers that can have low defect densities, and gallium nitride semiconductor layers so fabricated.

These and other objects are provided, according to the present invention, by fabricating a gallium nitride semiconductor layer by laterally growing an underlying gallium nitride layer to thereby form a first laterally grown gallium nitride semiconductor layer, and laterally growing the first laterally grown gallium nitride layer to thereby form a second laterally grown gallium nitride semiconductor layer. Microelectronic devices may then be formed in the second laterally grown gallium nitride semiconductor layer.

More specifically, in a preferred embodiment, a gallium nitride semiconductor layer is fabricated by masking an underlying gallium nitride layer with a first mask that includes a first array of openings therein and growing the underlying gallium nitride layer through the first array of openings and onto the first mask, to thereby form a first overgrown gallium nitride semiconductor layer. The first overgrown layer is then masked with the second mask that includes a second array of openings therein. The second array of openings is laterally offset from the first array of openings. The first overgrown gallium nitride layer is then grown through the second array of openings and onto the second mask, to thereby form a second overgrown gallium nitride semiconductor layer. Microelectronic devices may then be formed in the second overgrown gallium nitride semiconductor layer.

It has been found, according to the present invention, that although dislocation defects may propagate vertically from the underlying gallium nitride layer to the grown gallium nitride layer above the first mask openings, the first overgrown gallium nitride layer is relatively defect-free. Moreover, since the second array of mask openings is laterally offset from the first array of mask openings, the relatively defect-free overgrown first gallium nitride layer propagates through the second array of openings and onto the second mask. Accordingly, high performance microelectronic devices may be formed in the second overgrown gallium nitride semiconductor layer.

According to another aspect of the present invention, the second overgrown gallium nitride semiconductor layer is overgrown until the second overgrown gallium nitride layer coalesces on the second mask, to form a continuous overgrown monocrystalline gallium nitride semiconductor layer. The entire continuous overgrown layer can thus be relatively defect-free compared to the underlying gallium nitride layer.

The first and second gallium nitride semiconductor layers may be grown using metalorganic vapor phase epitaxy (MOVPE). Preferably, the openings in the masks are stripes that are oriented along the <1$\bar{1}$00> direction of the underlying gallium nitride layer. The overgrown gallium nitride layers may be grown using triethylgallium (TEG) and ammonia ($NH_3$) precursors at 1000–1100° C. and 45 Torr. Preferably, TEG at 13–39 $\mu$mol/min and $NH_3$ at 1500 sccm are used in combination with 3000 sccm $H_2$ diluent. Most preferably, TEG at 26 $\mu$mol/min, $NH_3$ at 1500 sccm and $H_2$ at 3000 sccm at a temperature of 1100° C. and 45 Torr are used. The underlying gallium nitride layer preferably is formed on a substrate, which itself includes a buffer layer such as aluminum nitride, on a substrate such as 6H—SiC (0001).

Gallium nitride semiconductor structures according to the present invention include an underlying gallium nitride layer, a first lateral gallium nitride layer that extends from the underlying gallium nitride layer and a second lateral gallium nitride layer that extends from the first lateral gallium nitride layer. A plurality of microelectronic devices are provided in the second lateral gallium nitride layer.

In a preferred embodiment, gallium nitride semiconductor structures according to the present invention include an underlying gallium nitride layer and a first mask that includes a first array of openings therein, on the underlying gallium nitride layer. A first vertical gallium nitride layer extends from the underlying gallium nitride layer through the first array of openings. A first lateral gallium nitride layer extends from the vertical gallium nitride layer onto the mask, opposite the underlying gallium nitride layer. A second mask on the first lateral gallium nitride layer includes a second array of openings therein that are laterally offset from the first array of openings. A second vertical gallium nitride layer extends from the first lateral gallium nitride layer and through the second array of openings. A second lateral gallium nitride layer extends from the second vertical gallium nitride layer onto the second mask, opposite the first lateral gallium nitride layer. A plurality of microelectronic devices including but not limited to optoelectronic devices and field emitters, are formed in the second vertical gallium nitride layer and in the second lateral gallium nitride layer.

Preferably, the second lateral gallium nitride layer is a continuous monocrystalline gallium nitride semiconductor layer. The underlying gallium nitride layer includes a predetermined defect density, and the second vertical and lateral gallium nitride semiconductor layers are of lower defect density than the predetermined defect density. Accordingly, continuous low defect density gallium nitride semiconductor layers may be produced, to thereby allow the production of high-performance microelectronic devices, using laterally offset masks.

DETAILED DESCRIPTION OF PREFERRED EMBODIMENTS

Figure 1:
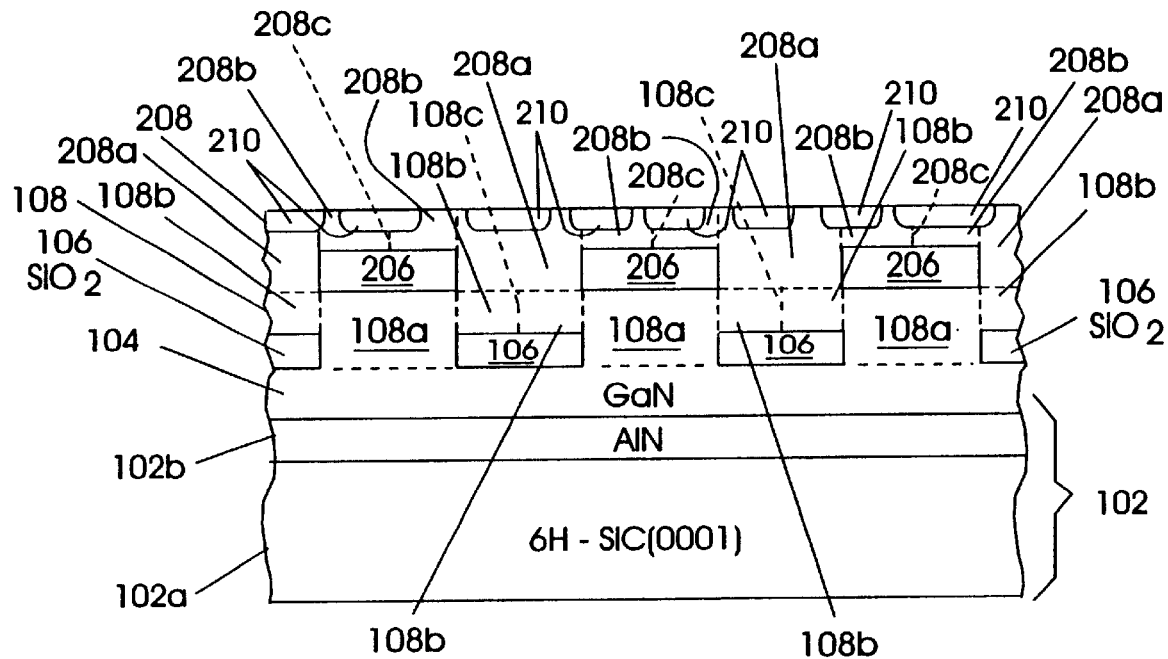
FIG. 1 is a cross-sectional view of gallium nitride semiconductor structures according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring now to FIG. 1, gallium nitride semiconductor structures according to the present invention are illustrated. The gallium nitride structures 200 include a substrate 102. The substrate may be sapphire or gallium nitride. However, preferably, the substrate includes a 6H—SiC(0001) substrate 102a and an aluminum nitride buffer layer 102b on the silicon carbide substrate 102a The aluminum nitride buffer layer 102b may 0.01 $\mu$m thick.

The fabrication of substrate 102 is well known to those having skill in the art and need not be described further. Fabrication of silicon carbide substrates are described, for example, in U.S. Pat. No. 4,865,685 to Palmour; Re 34,861 to Davis et al.; 4,912,064 to Kong et al. and 4,946,547 to Palmour et al., the disclosures of which are hereby incorporated herein by reference. Also, the crystallographic designation conventions used herein are well known to those having skill in the art, and need not be described further.

An underlying gallium nitride layer 104 is also included on buffer layer 102b opposite substrate 102a. The underlying gallium nitride layer 104 may be between about 1.0 and 2.0 $\mu$m thick, and may be formed using heated metalorganic vapor phase epitaxy (MOVPE). The underlying gallium nitride layer generally has an undesired relatively high defect density, for example dislocation densities of between about $10^8$ and $10^{10}$ cm$^{-2}$. These high defect densities may result from mismatches in lattice parameters between the buffer layer 102b and the underlying gallium nitride layer 104. These high defect densities may impact performance of microelectronic devices formed in the underlying gallium nitride layer 104.

Still continuing with the description of FIG. 1, a first mask such as a first silicon dioxide mask 106 is included on the underlying gallium nitride layer 104. The first mask 106 includes a first array of openings therein. Preferably, the first openings are first stripes that extend along the <1$\bar{1}$00> direction of the underlying gallium nitride layer 104. The first mask 106 may have a thickness of about 1000Å and may be formed on the underlying gallium nitride layer 104 using low pressure chemical vapor deposition (CVD) at 410° C. The first mask 106 may be patterned using standard photolithography techniques and etched in a buffered hydrofluoric acid (HF) solution.

Continuing with the description of FIG. 1, a first vertical gallium nitride layer 108a extends from the underlying gallium nitride layer 104 and through the first array of openings in the first mask 106. As used herein, the term "vertical" means a direction that is orthogonal to the faces of the substrate 102. The first vertical gallium nitride layer 108a may be formed using metalorganic vapor phase epitaxy at about 1000–1100° C. and 45 Torr. Precursors of triethygalliun (TEG) at 13–39 $\mu$mol/min and ammonia (NH$_3$) at 1500 sccm may be used in combination with a 3000 sccm H$_2$ diluent, to form the first vertical gallium nitride layer 108a.

Still continuing with the description of FIG. 1, the gallium nitride semiconductor structure 200 also includes a first lateral gallium nitride layer 108b that extends laterally from the first vertical gallium nitride layer 108a onto the first mask 106 opposite the underlying gallium nitride layer 104. The first lateral gallium nitride layer 108b may be formed using metalorganic vapor phase epitaxy as described above. As used herein, the term "lateral" denotes a direction parallel to the faces of substrate 102.

As shown in FIG. 1, first lateral gallium nitride layer 108b coalesces at first interfaces 108c to form a first continuous monocrystalline gallium nitride semiconductor layer 108. It has been found that the dislocation densities in the first underlying gallium nitride layer 104 generally do not propagate laterally with the same intensity as vertically. Thus, first lateral gallium nitride layer 108b can have a relatively low defect density, for example less that $10^4$cm$^{-2}$. It will also be understood that the first lateral gallium nitride layer 108b need not coalesce on the first mask 106.

Still continuing with the description of FIG. 1, a second mask such as a second silicon dioxide mask 206 is included on the first vertical gallium nitride layer 108a. As shown, second mask 206 is laterally offset from first mask 106. It will also be understood that second mask 206 may also extend onto first vertical gallium nitride layer 108b. Preferably, second mask 206 covers all of first vertical gallium nitride layer 108a such that defects in this layer do not propagate further. It will also be understood that the second mask 206 need not be symmetrically offset with respect to first mask 106. The second mask 206 includes a second array of openings therein. The second openings are preferably oriented as described in connection with the first mask 106. The second mask 206 also may be fabricated similar to first mask 106.

Continuing with the description of FIG. 1, a second vertical gallium nitride layer 208a extends from the first lateral gallium nitride layer 108a and through the second array of openings in the second mask 206. The second vertical gallium nitride layer 208a may be formed similar to first vertical gallium nitride layer 108a. The gallium nitride semiconductor structure 200 also includes a second lateral gallium nitride layer 208b that extends laterally from the second vertical gallium nitride layer 208a onto the second mask 206 opposite the first gallium nitride layer 108. The second lateral gallium nitride layer 208b may be formed using metalorganic vapor phase epitaxy as was described above.

As shown in FIG. 1, the second lateral gallium nitride layer 208b coalesces at second interfaces 208c, to form a second continuous monocrystalline gallium nitride semiconductor layer 208. It has been found that since the first lateral gallium nitride layer 108b is used to grow second gallium nitride layer 208, the second gallium nitride layer 208 including second vertical gallium nitride layer 208a and second lateral gallium nitride layer 208b, can have a relatively low defect density, for example less than $10^4 cm^{-2}$. Accordingly, the entire gallium nitride layer 208 can form device quality gallium nitride semiconductor material. Thus, as shown in FIG. 1, microelectronic devices 210 may be formed in both the second vertical gallium nitride layer 208a and the second lateral gallium nitride layer 208b, and may bridge these layers as well. By offsetting masks 106 and 206, a continuous device quality gallium nitride layer may be obtained.

Figure 2:
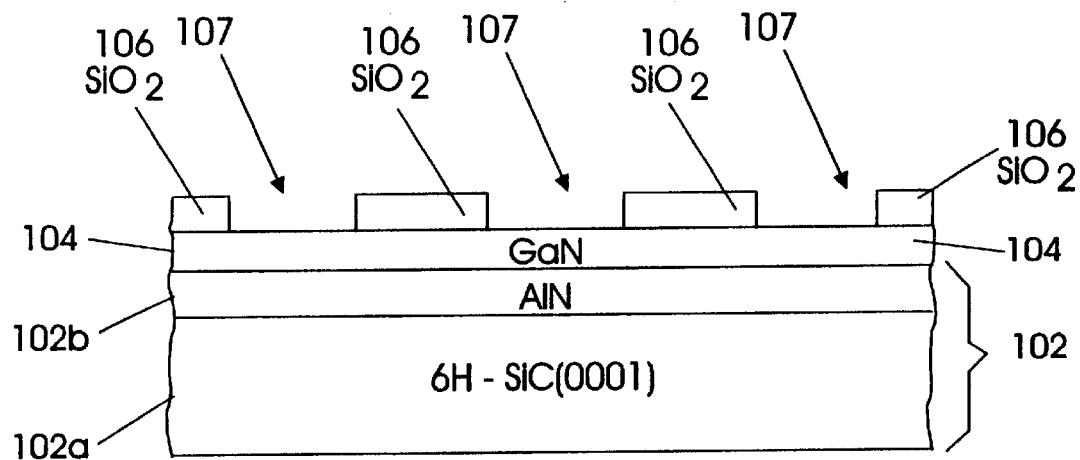
FIGS. 2–9 are cross-sectional views of structures of FIG. 1 during intermediate fabrication steps, according to the present invention.

Referring now to FIGS. 2–9, methods of fabricating gallium nitride semiconductor structures according to the present invention will now be described. As shown in FIG. 2, an underlying gallium nitride layer 104 is grown on a substrate 102. The substrate 102 may include a 6H—SiC (0001) substrate 102a and an aluminum nitride buffer layer 102b. The gallium nitride layer 104 may be between 1.0 and 2.0 $\mu$m thick, and may be grown at 1000° C. on a high temperature (1100° C.) aluminum nitride buffer layer 102b that was deposited on 6H—SiC substrate 102a in a cold wall vertical and inductively heated metalorganic vapor phase epitaxy system using triethylgallium at 26 $\mu$mol/min, ammonia at 1500 sccm and 3000 sccm hydrogen diluent. Additional details of this growth technique may be found in a publication by T. W. Weeks et al. entitled "GaN Thin Films Deposited Via Organometallic Vapor Phase Epitaxy on a(6H)-SiC(0001) Using High-Temperature Monocrystalline AlN Buffer Layers", Applied Physics Letters, Vol. 67, No. 3, Jul. 17, 1995, pp. 401–403, the disclosure of which is hereby incorporated herein by reference. Other substrates, with or without buffer layers, may be used.

Still referring to FIG. 2, the underlying gallium nitride layer 104 is masked with a first mask 106 that includes a first array of openings 107 therein. The first mask may comprise silicon dioxide at thickness of 1000 Å and may be deposited using low pressure chemical vapor deposition at 410° C. Other masking materials may be used. The first mask may be patterned using standard photolithography techniques and etching in a buffered HF solution. In one embodiment, the first openings 107 are 3 $\mu$m-wide openings that extend in parallel at distances of between 3 and 40 $\mu$m and that are oriented along the <1$\bar{1}$00> direction on the underlying gallium nitride layer 104. Prior to further processing, the structure may be dipped in a 50% buffered hydrochloric acid (HCl) solution to remove surface oxides from the underlying gallium nitride layer 104.

Figure 3:
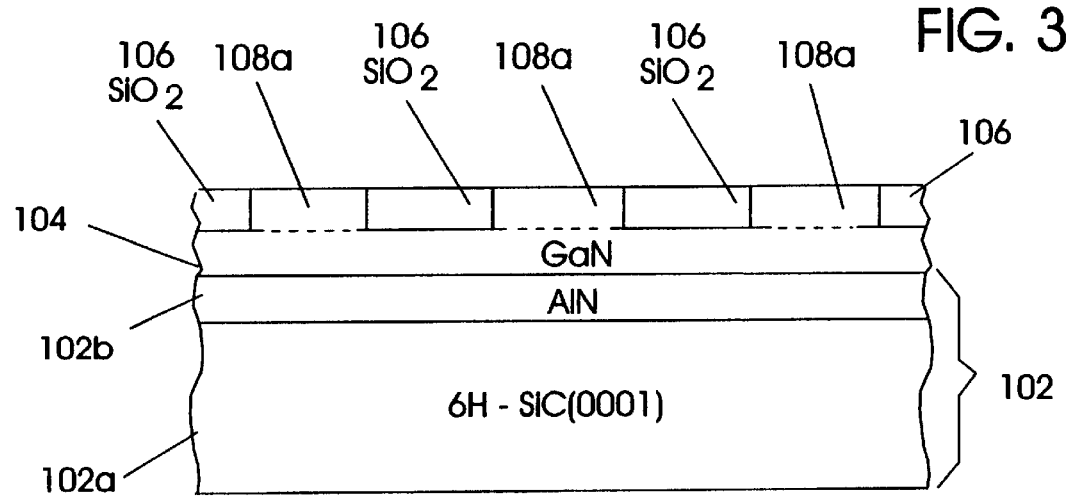

Referring now to FIG. 3, the underlying gallium nitride layer 104 is grown through the first array of openings 107 to form first vertical gallium nitride layer 108a in the first openings. Growth of gallium nitride may be obtained at 1000–1100° C. and 45 Torr. The precursors TEG at 13–39 $\mu$mol/min and NH$_3$ at 1500 sccm may be used in combination with a 3000 sccm H$_2$ diluent. If gallium nitride alloys are formed, additional conventional precursors of aluminum or indium, for example, may also be used. As shown in FIG. 3, the first gallium nitride layer 108a grows vertically to the top of the first mask 106.

It will be understood that underlying gallium nitride layer 104 may also be grown laterally without using a mask 106, by appropriately controlling growth parameters and/or by appropriately patterning the underlying gallium nitride layer 104. A patterned layer may be formed on the underlying gallium nitride layer after vertical growth or lateral growth, and need not function as a mask.

It will also be understood that lateral growth in two dimensions may be used to form an overgrown gallium nitride semiconductor layer. Specifically, mask 106 may be be patterned to include an array of openings 107 that extend along two orthogonal directions such as <1$\bar{1}$00> and <11$\bar{2}$0>. Thus, the openings can form a rectangle of orthogonal striped patterns. In this case, the ratio of the edges of the rectangle is preferably proportional to the ratio of the growth rates of the $\{11\bar{2}0\}$ and $\{1\bar{1}01\}$ facets, for example, in a ratio of 1.4:1.

Figure 4:
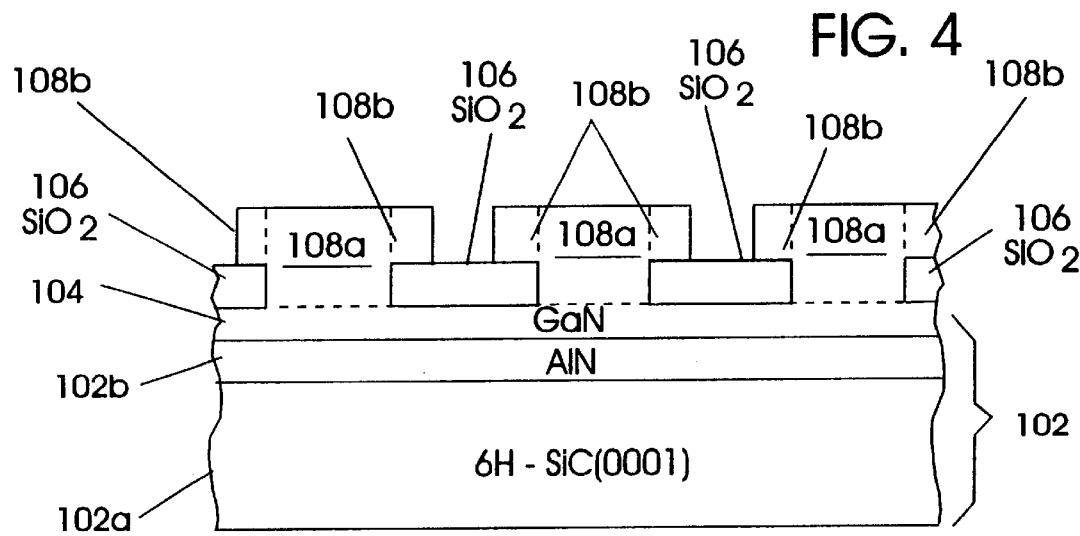

Referring now to FIG. 4, continued growth of the first gallium nitride layer 108a causes lateral overgrowth onto the first mask 106, to form first lateral gallium nitride layer 108b. Growth conditions for overgrowth may be maintained as was described in connection with FIG. 3.

Figure 5:
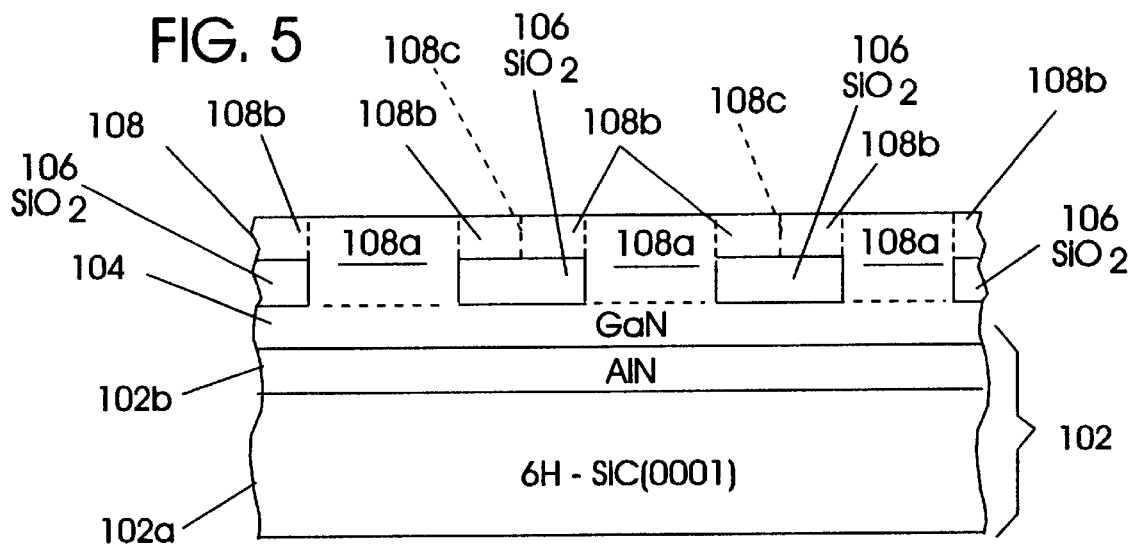

Referring now to FIG. 5, lateral overgrowth is optionally allowed to continue until the lateral growth fronts coalesce at first interfaces 108c, to form a first continuous gallium nitride layer 108. The total growth time may be approximately 60 minutes.

Figure 6:
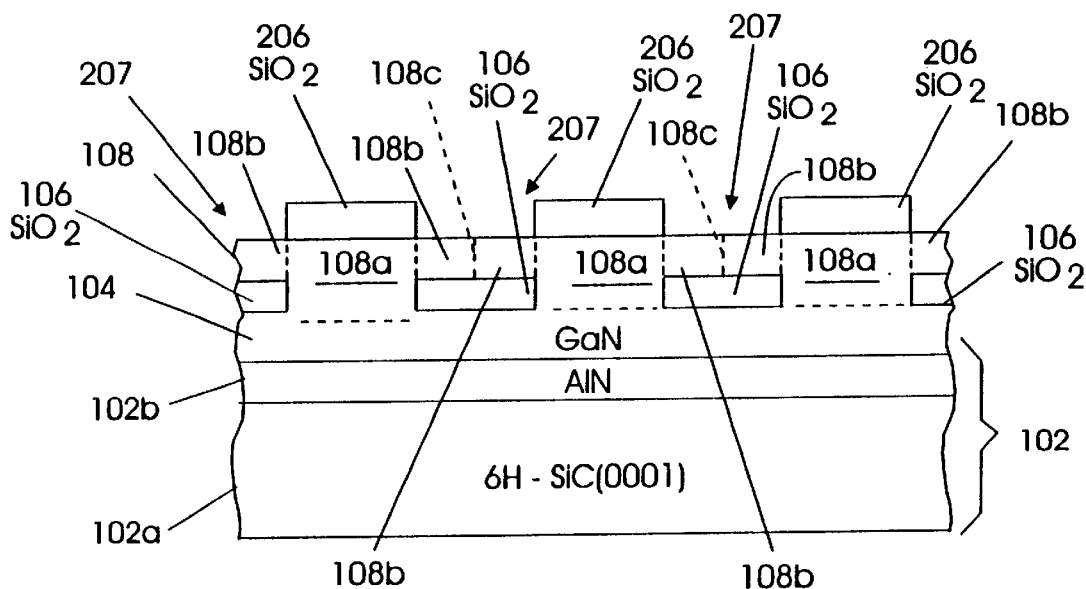

Referring now to FIG. 6, the first vertical gallium nitride layer 108a is masked with a second mask 206 that includes a second array of openings 207 therein. The second mask may be fabricated as was described in connection with the first mask. The second mask may also be eliminated, as was described in connection with the first mask of FIG. 3. The second mask may also be eliminated, as was described in connection with FIG. 3. As already noted, the second mask 206 preferably covers the entire first vertical gallium nitride layer 108a, so as to prevent defects therein from propagating vertically or laterally. In order to provide defect-free propagation, mask 206 may extend onto first lateral gallium nitride layer 108b as well.

Figure 7:
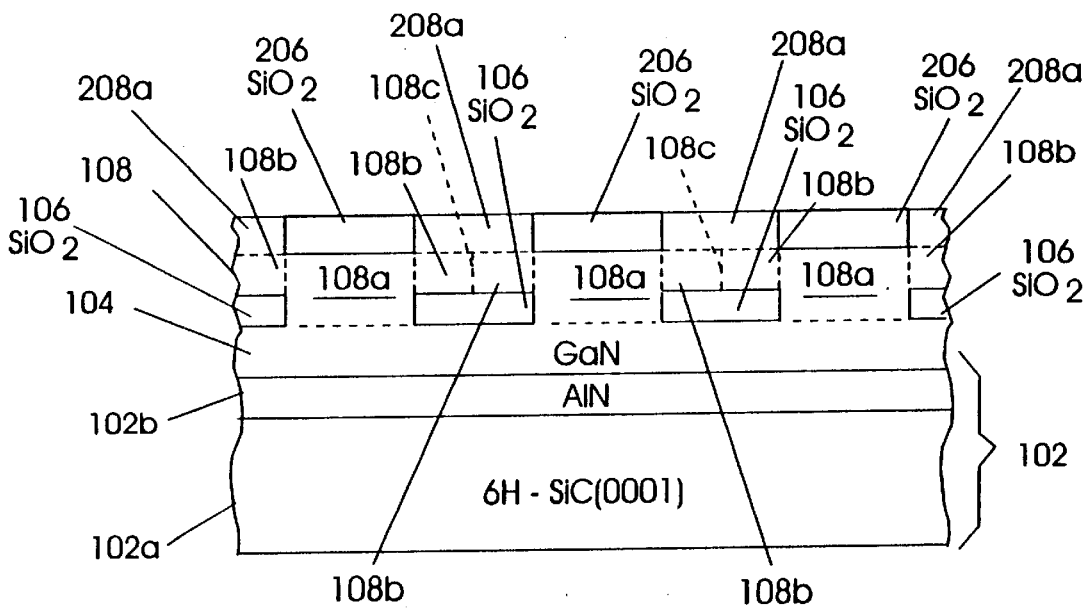

Referring now to FIG. 7, the first lateral gallium nitride layer 108c is grown vertically through the second array of openings 207, to form second vertical gallium nitride layer 208a in the second openings. Growth may be obtained as was described in connection with FIG. 3.

Figure 8:
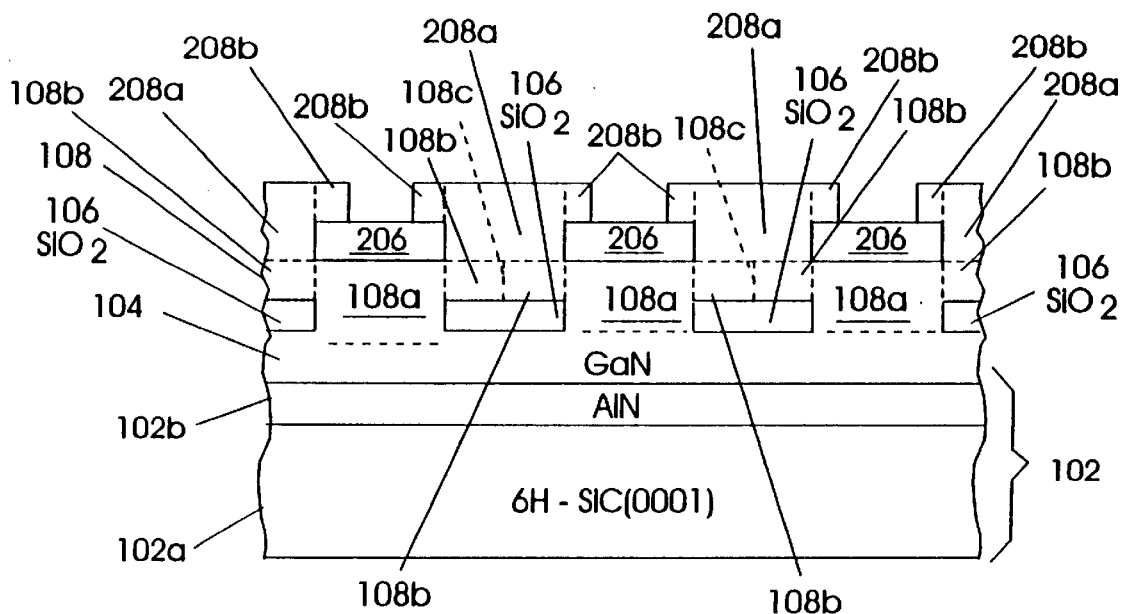

Referring now to FIG. 8, continued growth of the second gallium nitride layer 208a causes lateral overgrowth onto the second mask 206, to form second lateral gallium nitride layer 208b. Lateral growth may be obtained as was described in connection with FIG. 3.

Figure 9:
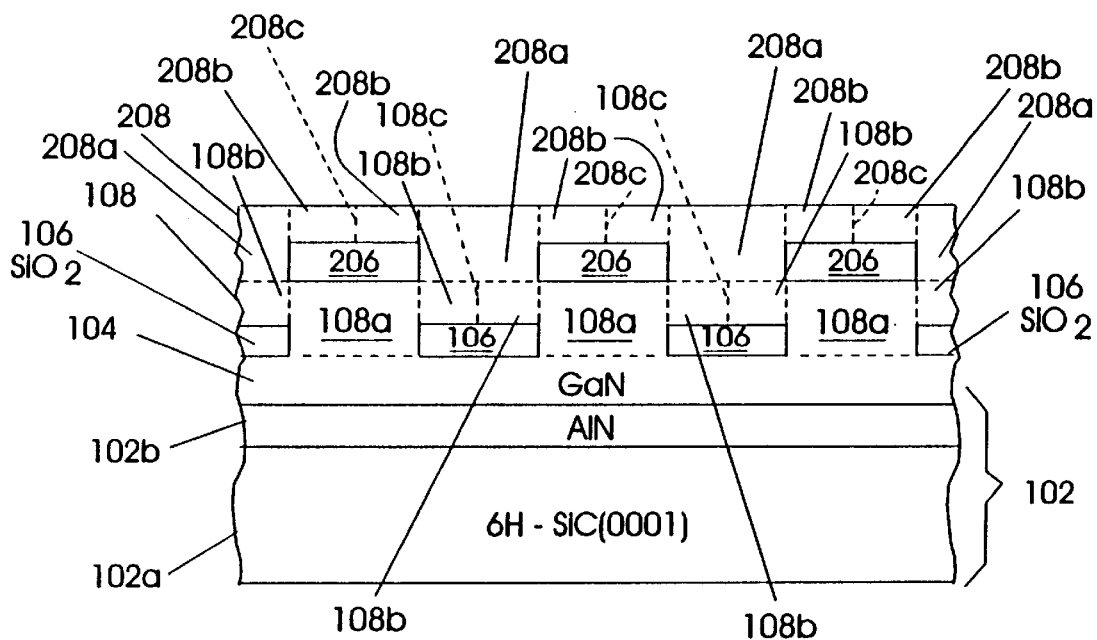

Referring now to FIG. 9, lateral overgrowth preferably continues until the lateral growth fronts coalesce at second interfaces 208c to form a second continuous gallium nitride layer 208. Total growth time may be approximately 60 minutes. Microelectronic devices may then be formed in regions 208a and in regions 208b as shown in FIG. 1, because both of these regions are of relatively low defect density. Devices may bridge these regions as well, as shown. Accordingly, a continuous device quality gallium nitride layer 208 may be formed.

Additional discussion of the methods and structures of the present invention will now be provided. As described above, the openings 107 and 207 in the masks are preferably rectangular stripes that preferably extend along the <11$\bar{2}$0> and/or <1$\bar{1}$00> directions relative to the underlying gallium nitride layer 104. Truncated triangular stripes having (1$\bar{1}$01) slant facets and a narrow (0001) top facet may be obtained for mask openings 107 and 207 along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes if the growth is continued.

The amount of lateral growth generally exhibits a strong dependence on stripe orientation. The lateral growth rate of the <1$\bar{1}$00> oriented stripes is generally much faster than those along <11$\bar{2}$0>. Accordingly, it is most preferred to orient the openings 107 and 207 so that they extend along the <1$\bar{1}$00> direction of the underlying gallium nitride layer 104.

The different morphological development as a function of opening orientation appears to be related to the stability of the crystallographic planes in the gallium nitride structure. Stripes oriented along <11$\bar{2}$0> may have wide (1$\bar{1}$00) slant facets and either a very narrow or no (0001) top facet depending on the growth conditions. This may be because (1$\bar{1}$01) is the most stable plane in the gallium nitride wurtzite crystal structure, and the growth rate of this plane is lower than that of others. The {1$\bar{1}$01} planes of the <1$\bar{1}$00> oriented stripes may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of stripes oriented along <11$\bar{2}$0>.

The morphologies of the gallium nitride layers selectively grown on openings oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenide on silicon dioxide. Accordingly, temperatures of 1100° C. appear to be most preferred.

The morphological development of the gallium nitride regions also appears to depend on the flow rate of the TEG. An increase in the supply of TEG generally increases the growth rate of the stripes in both the lateral and the vertical directions. However, the lateral/vertical growth rate ratio decrease from 1.7 at the TEG flow rate of 13 $\mu$mol/min to 0.86 at 39 $\mu$mol.min. This increased influence on growth rate along <0001> relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 $\mu$m thick gallium nitride layers 108 and 208 may be obtained using 3 $\mu$m wide stripe openings 107 and 207 spaced 7 $\mu$m apart and oriented along <1$\bar{1}$00>, at 1100° C. and a TEG flow rate of 26 $\mu$mol/min. The overgrown gallium nitride layers 108b and 208b may include subsurface voids that form when two growth fronts coalesce. These voids may occur most often using lateral growth conditions wherein rectangular stripes having vertical {11$\bar{2}$0} side facets developed.

The coalesced gallium nitride layers 108 and 208 may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layers 104.

Threading dislocations, originating from the interface between the gallium nitride underlayer 104 and the buffer layer 102b, appear to propagate to the top surface of the first vertical gallium nitride layer 108a within the first openings 107 of the first mask 106. The dislocation density within these regions is approximately $10^9 cm^{-2}$. By contrast, threading dislocations do not appear to readily propagate into the first overgrown regions 108b. Rather, the first overgrown gallium nitride regions 108b contain only a few dislocations. These few dislocations may be formed parallel to the (0001) plane via the extension of the vertical threading dislocations after a 90° bend in the regrown region. These dislocations do not appear to propagate to the top surface of the first overgrown GaN layer. Since both the second vertical gallium nitride layer 208a and the second lateral gallium nitride layer 208b propagate from the low defect first overgrown gallium nitride layer 108b, the entire layer 208 can have low defect density.

As described, the formation mechanism of the selectively grown gallium nitride layer is lateral epitaxy. The two main stages of this mechanism are vertical growth and lateral growth. During vertical growth, the deposited gallium nitride grows selectively within the mask openings 107 and 207 more rapidly than it grows on the masks 106 and 206, apparently due to the much higher sticking coefficient, s, of the gallium atoms on the gallium nitride surface (s=1) compared to on the mask (s~1). Since the $SiO_2$ bond strength is 799.6 kJ/mole and much higher than that of Si—N(439 kJ/mole), Ga—N (103 kJ/mole), and Ga—O (353.6 kJ/mole), Ga or N atoms should not readily bond to the mask surface in numbers and for a time sufficient to cause gallium nitride nuclei to form. They would either evaporate or diffuse along the mask surface to the openings 107 or 207 in the masks or to the vertical gallium nitride surfaces 108a or 208a which have emerged. During lateral growth, the gallium nitride grows simultaneously both vertically and laterally over the mask from the material which emerges over the openings.

Surface diffusion of gallium and nitrogen on the masks may play a minor role in gallium nitride selective growth.

The major source of material appears to be derived from the gas phase. This may be demonstrated by the fact that an increase in the TEG flow rate causes the growth rate of the (0001) top facets to develop faster than the ($1\bar{1}01$) side facets and thus controls the lateral growth.

The laterally grown gallium nitride layers 108b and 208b bond to the underlying masks 106 and 206 sufficiently strongly so that they generally do not break away on cooling. However, lateral cracking within the $SiO_2$ may take place due to thermal stresses generated on cooling. The viscosity ($\rho$) of the $SiO_2$ at 1050° C. is about $10^{15.5}$ poise which is one order of magnitude greater than the strain point (about $10^{14.5}$ poise) where stress relief in a bulk amorphous material occurs within approximately six hours. Thus, the $SiO_2$ mask may provide limited compliance on cooling. As the atomic arrangement on the amorphous $SiO_2$ surface is quite different from that on the GaN surface, chemical bonding may occur only when appropriate pairs of atoms are in close proximity. Extremely small relaxations of the silicon and oxygen and gallium and nitrogen atoms on the respective surfaces and/or within the bulk of the $SiO_2$ may accommodate the gallium nitride and cause it to bond to the oxide.

Accordingly, regions of lateral epitaxial overgrowth through mask openings from an underlying gallium nitride layer may be achieved via MOVPE. The growth may depend strongly on the opening orientation, growth temperature and TEG flow rate. Coalescence of overgrown gallium nitride regions to form regions with both extremely low densities of dislocations and smooth and pit-free surfaces may be achieved through 3 μm wide mask openings spaced 7 μm apart and extending along the <$1\bar{1}00$> direction, at 1100° C. and a TEG flow rate of 26 μmol/min. The lateral overgrowth of gallium nitride via MOVPE may be used to obtain low defect density continuous gallium nitride layers for microelectronic devices.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A gallium nitride semiconductor structure comprising:
   a non-gallium nitride layer,
   an underlying gallium nitride layer on the non-gallium nitride layer;
   a first patterned layer that includes a first array of openings therein, on the underlying gallium nitride layer;
   a first vertical gallium nitride layer that extends from the underlying gallium nitride layer and through the first array of openings;
   a first lateral gallium nitride layer that extends from the first vertical gallium nitride layer onto the first patterned layer opposite the underlying gallium nitride layer and that coalesces on the first patterned layer opposite the underlying gallium nitride layer;
   a second patterned layer that includes a second array of openings therein, on the first lateral gallium nitride layer, the second array of openings being laterally offset from the first array of openings;
   a second vertical gallium nitride layer that extends from the first lateral gallium nitride layer and through the second array of openings; and
   a second lateral gallium nitride layer that extends from the second vertical gallium nitride layer onto the second patterned layer opposite the first lateral gallium nitride layer and that coalesces on the second patterned layer opposite the first lateral gallium nitride layer;
   wherein the underlying gallium nitride layer and the first vertical gallium nitride layer include a predetermined dislocation defect density; and
   wherein the second vertical gallium nitride layer and the second lateral gallium nitride semiconductor layer are of lower dislocation defect density than the predetermined dislocation defect density.

2. A structure according to claim 1 further comprising: at least one microelectronic device in the second lateral gallium nitride layer and that extends into the second vertical gallium nitride layer.

3. A structure according to claim 1 wherein the second lateral gallium nitride layer that coalesces on the second patterned layer is a continuous monocrystalline gallium nitride semiconductor layer.

4. A structure according to claim 1 wherein the non-gallium nitride layer comprises a non-gallium nitride substrate.

5. A structure according to claim 4 further comprising a buffer layer between the substrate and the underlying gallium nitride layer.

6. A gallium nitride semiconductor structure comprising:
   a non-gallium nitride layer;
   an underlying gallium nitride layer on the non-gallium nitride layer and having dislocation defect density of less than $10^4$ $cm^{-2}$;
   a first lateral monocrystalline gallium nitride layer that extends from the underlying gallium nitride layer and having dislocation defect density of less than $10^4$ $cm^{-2}$;
   a second lateral monocrystalline gallium nitride layer having dislocation defect density of less than $10^4$ $cm^{-2}$ that extends from the first lateral monocrystalline gallium nitride layer having dislocation defect density of at least $10^8$ $cm^{-2}$;
   at least one microelectronic device in the second lateral monocrystalline gallium nitride layer having dislocation defect density of less than $10^4$ $cm^{-2}$;
   a first vertical gallium nitride layer having dislocation defect density of at least $10^8$ $cm^{-2}$ between the underlying gallium nitride layer and the first lateral monocrystalline gallium nitride layer;
   a second vertical gallium nitride layer having dislocation defect density of less than $10^4$ $cm^{-2}$ between the first lateral monocrystalline gallium nitride layer and the second lateral monocrystalline gallium nitride layer; and
   at least one microelectronic device in the second vertical gallium nitride layer having dislocation defect density of less than $10^4$ $cm^{-2}$.

7. A structure according to claim 6 wherein the second lateral monocrystalline gallium nitride layer is a continuous monocrystalline gallium nitride semiconductor layer having dislocation defect density of less than $10^4$ $cm^{-2}$ throughout.

8. A structure according to claim 6 wherein the non-gallium nitride layer comprises a non-gallium nitride substrate.

9. A structure according to claim 1 wherein the first and second patterned layers each include respective third and fourth arrays of openings therein that extend along a <$11\bar{2}0$> direction of the underlying gallium nitride layer.

10. A structure according to claim 9 wherein the first and third arrays of openings and the second and fourth arrays of openings are arranged in rectangles on the underlying gallium nitride layer and on the first lateral gallium nitride layer respectively, the rectangles having edges of predetermined lengths, and wherein a ratio of the predetermined lengths is proportional to a ratio of growth rates of a $\{11\overline{2}0\}$ facet and a $\{1\overline{1}01\}$ facet of the underlying gallium nitride layer.

11. A structure according to claim 1 further comprising:
a microelectronic device in the second lateral gallium nitride layer that extends into the second vertical gallium nitride layer.

12. A structure according to claim 6 wherein the first lateral gallium nitride layer includes spaced apart stripes that extend along a $<1\overline{1}00>$ direction of the underlying gallium nitride layer.

13. A structure according to claim 6 wherein the first lateral gallium nitride layer includes spaced apart stripes that extend along a $<11\overline{2}0>$ direction of the underlying gallium nitride layer.

14. A structure according to claim 6 wherein the first lateral gallium nitride layer includes an array of first spaced apart regions that extend along a $<11\overline{2}0>$ direction of the underlying gallium nitride layer, and an array of second spaced apart regions that extend along a $<1\overline{1}00>$ direction of the underlying gallium nitride layer.

15. A structure according to claim 14 wherein the array of first regions and the array of second spaced apart regions are arranged in a rectangle in the first lateral gallium nitride layer, the rectangle having edges of predetermined lengths, and wherein a ratio of the predetermined lengths is proportional to a ratio of growth rates of a $\{11\overline{2}0\}$ facet and a $\{1\overline{1}01\}$ facet of the first lateral gallium nitride layer.

16. A structure according to claim 1 wherein the first and second arrays of openings extend along a $<1\overline{1}00>$ direction of the underlying gallium nitride layer.

* * * * *